United States Patent
Yoo et al.

(10) Patent No.: US 11,011,689 B2
(45) Date of Patent: May 18, 2021

(54) QUANTUM DOT LED PACKAGE AND QUANTUM DOT LED MODULE INCLUDING THE SAME

(71) Applicant: LUMENS CO., LTD., Yongin-si (KR)

(72) Inventors: Sunghwan Yoo, Yongin-si (KR); Dohyoung Kang, Yongin-si (KR); Sungsik Jo, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 0 days.

(21) Appl. No.: 16/632,513

(22) PCT Filed: Mar. 12, 2019

(86) PCT No.: PCT/KR2019/002823
§ 371 (c)(1),
(2) Date: Jan. 20, 2020

(87) PCT Pub. No.: WO2020/054933
PCT Pub. Date: Mar. 19, 2020

(65) Prior Publication Data
US 2020/0403133 A1 Dec. 24, 2020

(30) Foreign Application Priority Data
Sep. 13, 2018 (KR) .................. 10-2018-0109557

(51) Int. Cl.
*H01L 33/64* (2010.01)
*H01L 33/50* (2010.01)
(Continued)

(52) U.S. Cl.
CPC ............ *H01L 33/642* (2013.01); *H01L 24/32* (2013.01); *H01L 24/83* (2013.01); (Continued)

(58) Field of Classification Search
CPC ..... H01L 33/642; H01L 33/64; H01L 33/644; H01L 33/60; H01L 33/56; H01L 33/502; (Continued)

(56) References Cited

U.S. PATENT DOCUMENTS

2016/0240746 A1 8/2016 Yun et al.
2018/0040786 A1* 2/2018 Chen ...................... H01L 33/505

FOREIGN PATENT DOCUMENTS

JP 2006-332618 A 12/2006
JP 2006332618 A * 12/2006
(Continued)

*Primary Examiner* — Marcos D. Pizarro
*Assistant Examiner* — Antonio B Crite
(74) *Attorney, Agent, or Firm* — Mei & Mark LLP

(57) ABSTRACT

A quantum dot LED package is disclosed. The quantum dot LED package includes: a heat dissipating reflector having a through cavity; a quantum dot plate accommodated in the upper portion of the through cavity; an LED chip accommodated in the lower portion of the through cavity and whose top surface is coupled to the lower surface of the quantum dot plate; electrode pads disposed on the lower surface of the LED chip and protruding more downward than the lower surface of the heat dissipating reflector; and a resin part formed in the through cavity to fix between the LED chip and the reflector and between the quantum dot plate and the reflector.

14 Claims, 9 Drawing Sheets

(51) Int. Cl.
  *H01L 33/60* (2010.01)
  *H01L 33/62* (2010.01)
  *H01L 33/54* (2010.01)
  *H01L 23/00* (2006.01)
  *H01L 25/075* (2006.01)
  *H01L 25/16* (2006.01)

(52) U.S. Cl.
  CPC ........ *H01L 25/0753* (2013.01); *H01L 25/167* (2013.01); *H01L 33/505* (2013.01); *H01L 33/60* (2013.01); *H01L 33/62* (2013.01); *H01L 33/644* (2013.01); *H01L 33/502* (2013.01); *H01L 33/54* (2013.01); *H01L 2224/32227* (2013.01); *H01L 2224/80395* (2013.01); *H01L 2224/83799* (2013.01); *H01L 2224/83815* (2013.01); *H01L 2933/005* (2013.01); *H01L 2933/0058* (2013.01); *H01L 2933/0066* (2013.01); *H01L 2933/0075* (2013.01)

(58) Field of Classification Search
  CPC ..... H01L 33/50; H01L 33/501; H01L 33/504; H01L 25/167
  See application file for complete search history.

(56) References Cited

FOREIGN PATENT DOCUMENTS

| | | |
|---|---|---|
| JP | 2013-080860 A | 5/2013 |
| JP | 2017-016859 A | 1/2017 |
| JP | 2017-045902 A | 3/2017 |
| JP | 2018-056552 A | 4/2018 |
| KR | 2017-0052199 A | 5/2017 |
| KR | 2017-0066257 A | 6/2017 |

* cited by examiner

【FIG. 1】
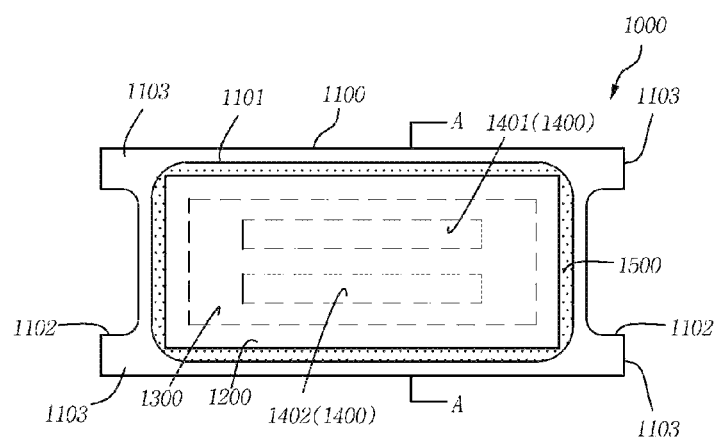
【FIG. 2】
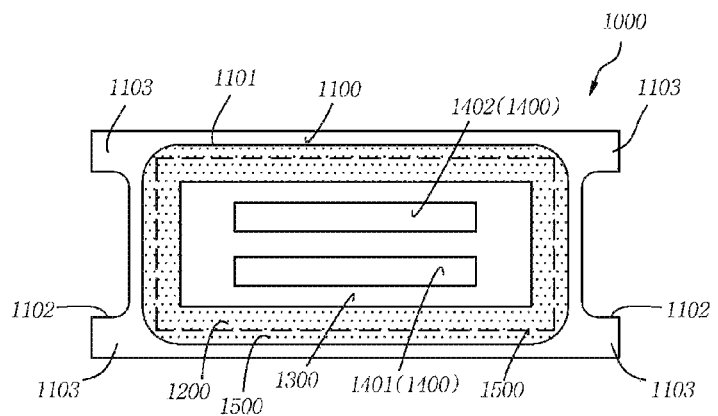

[FIG. 3]
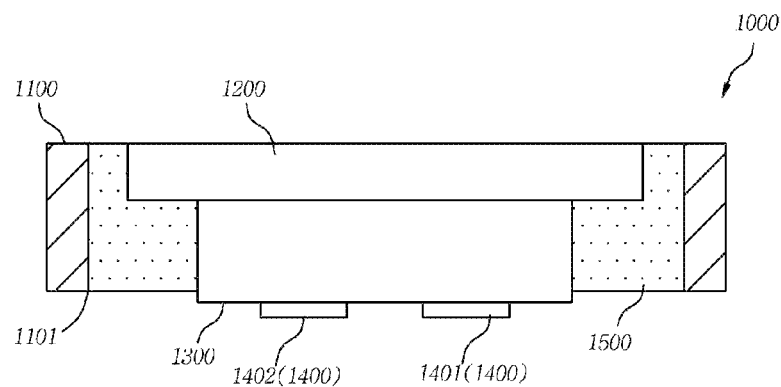
[FIG. 4]
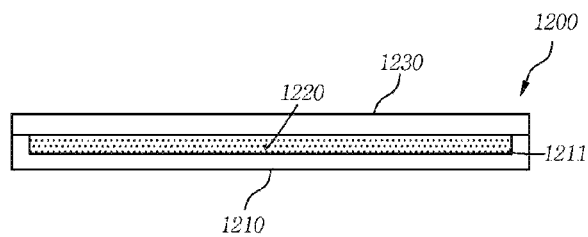
[FIG. 5]
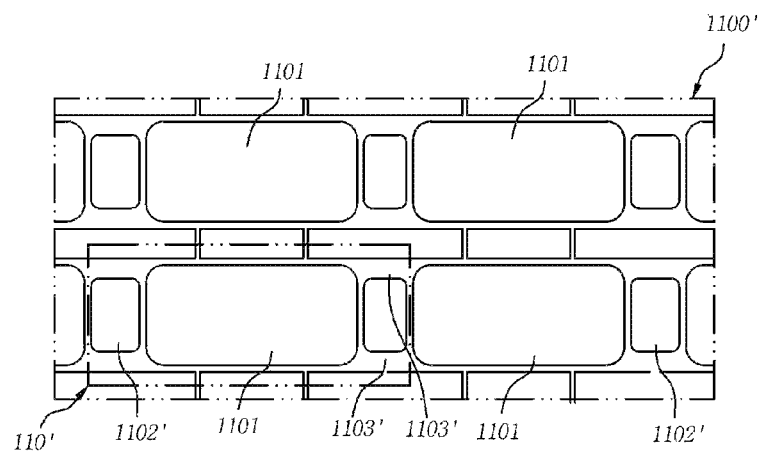

【FIG. 6】
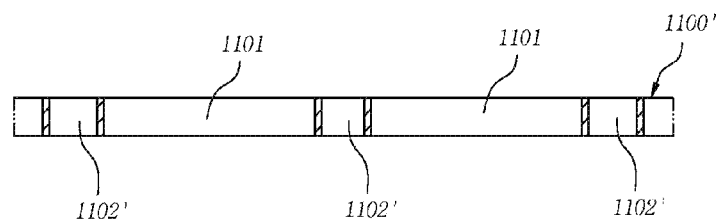
【FIG. 7】
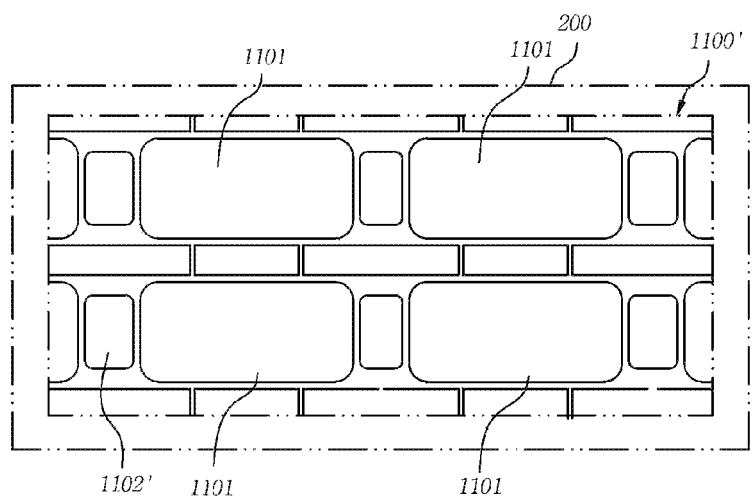
【FIG. 8】
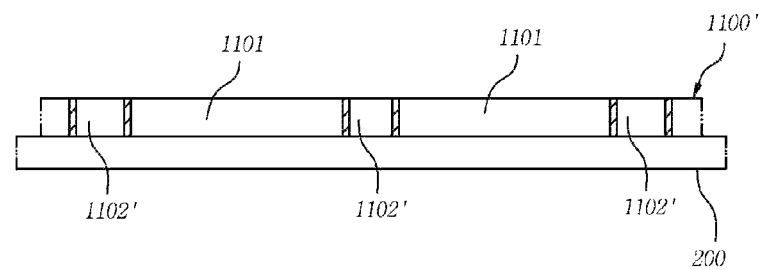

【FIG. 9】
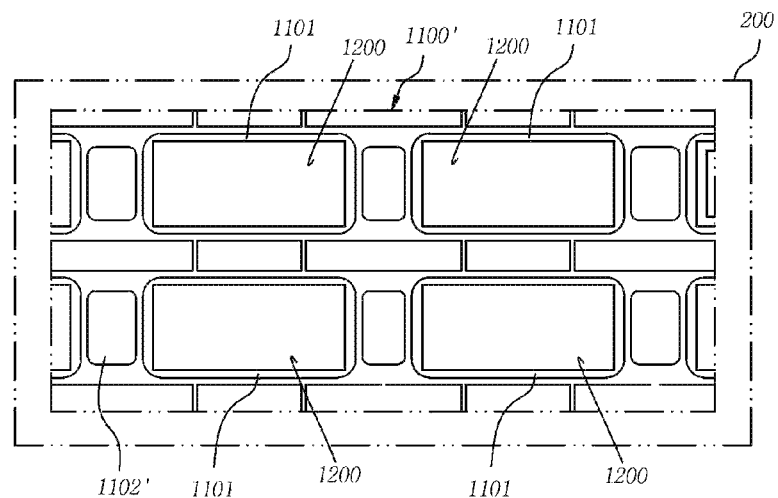
【FIG. 10】
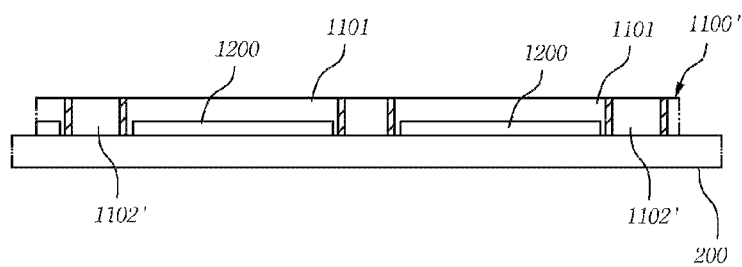
【FIG. 11】
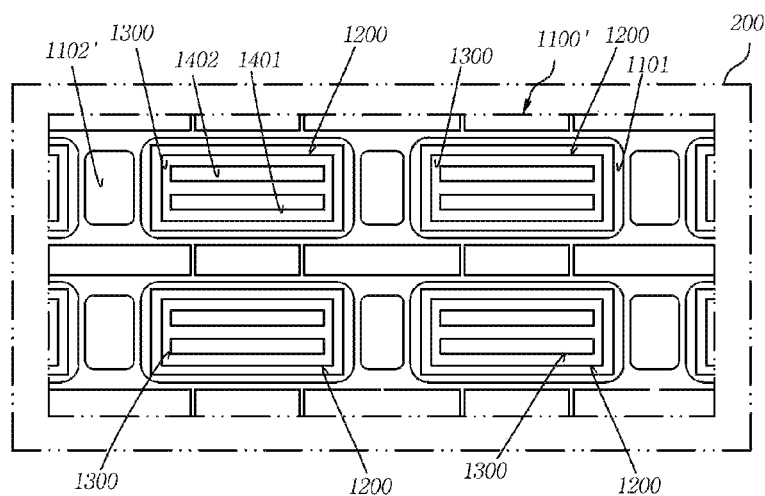

[FIG. 12]
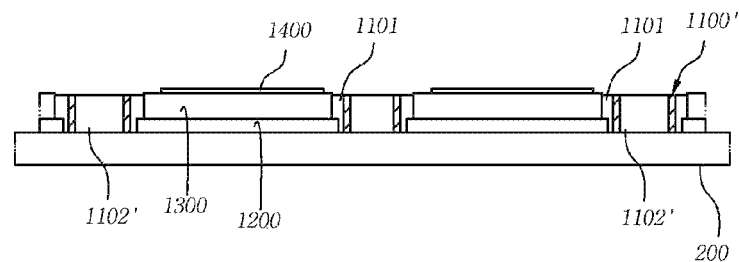
[FIG. 13]
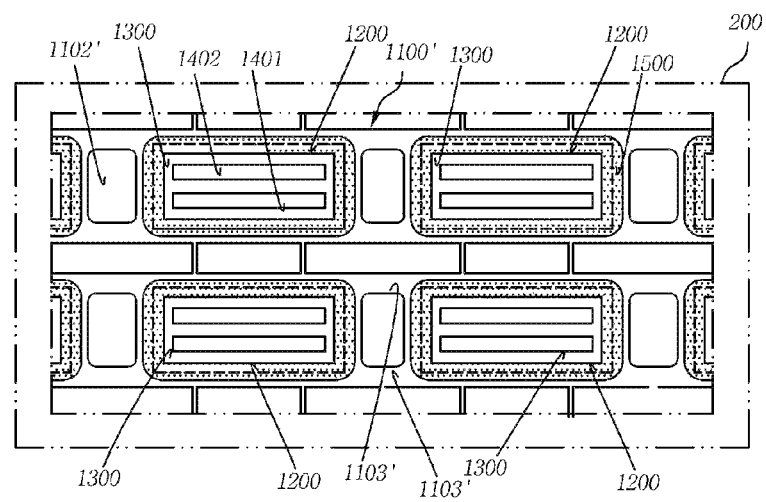
[FIG. 14]
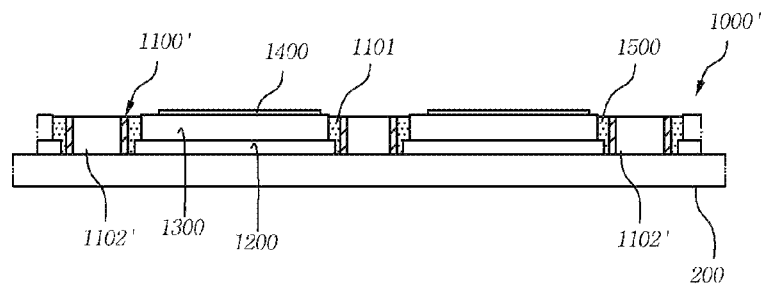

[FIG. 15]
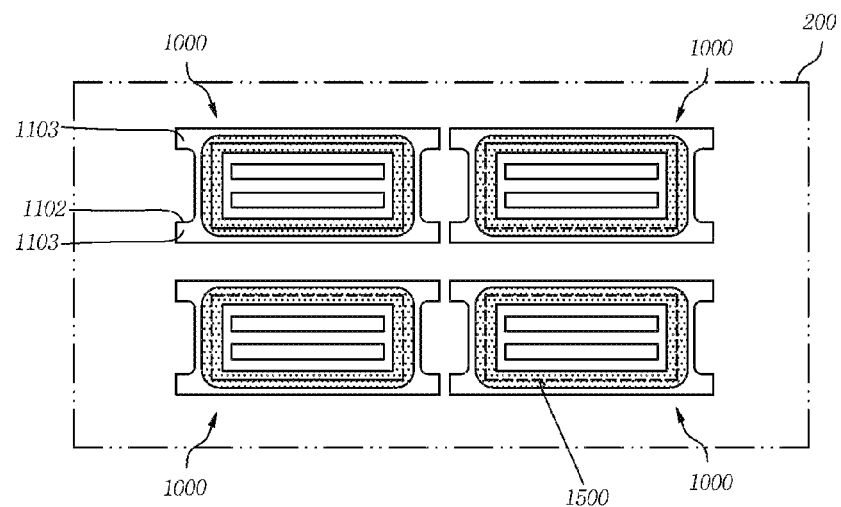
[FIG. 16]
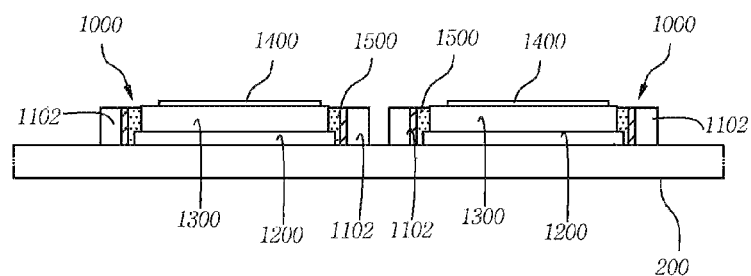
[FIG. 17]
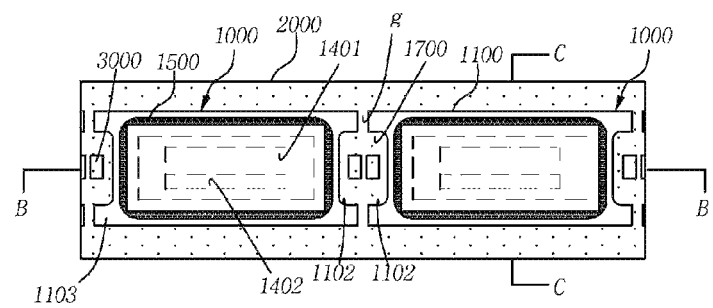

[FIG. 18]
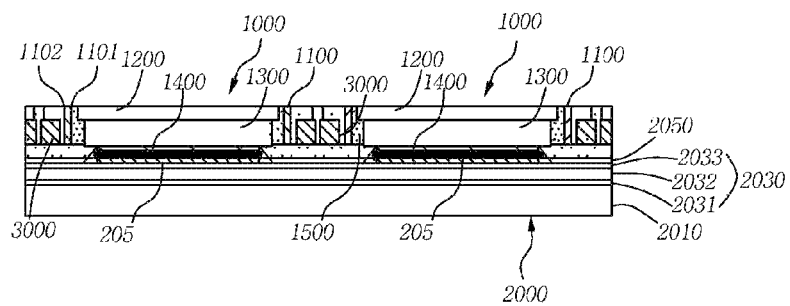
[FIG. 19]
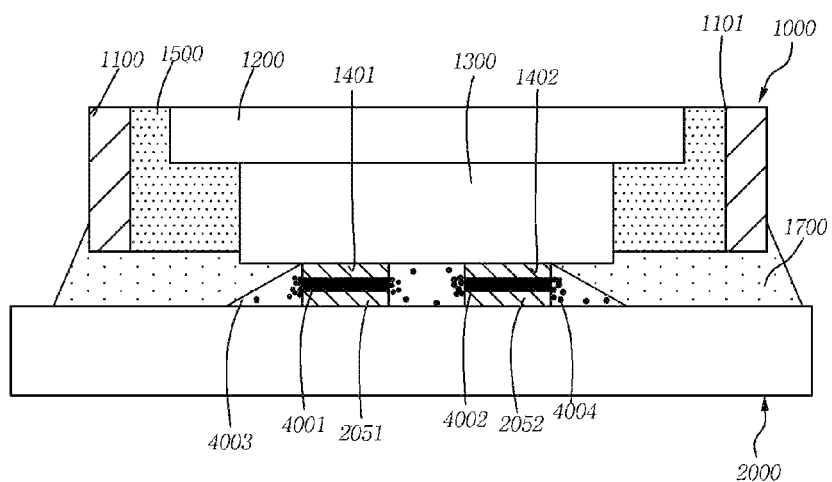
[FIG. 20]
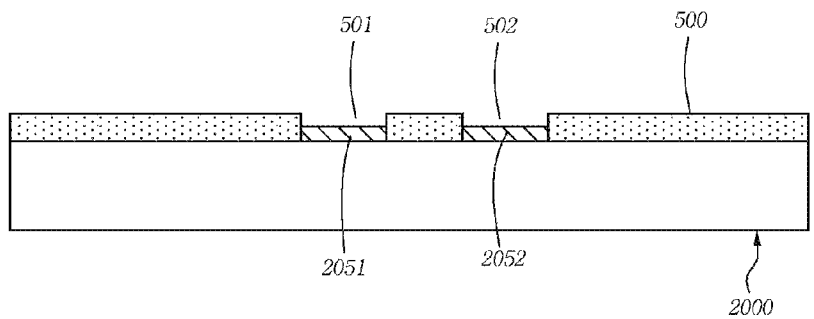

[FIG. 21]
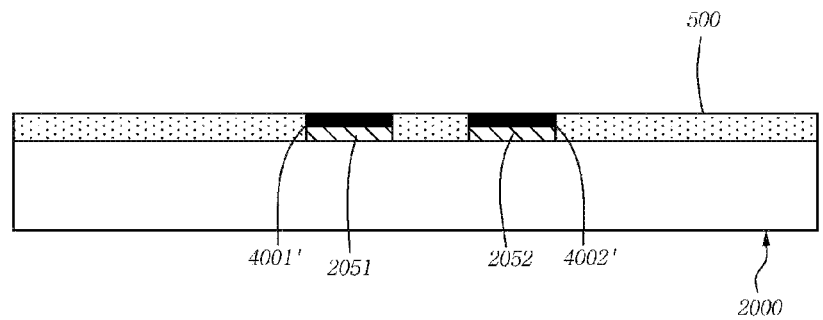
[FIG. 22]
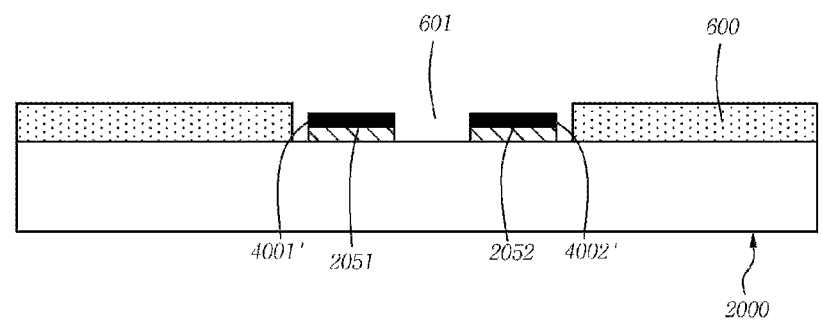
[FIG. 23]
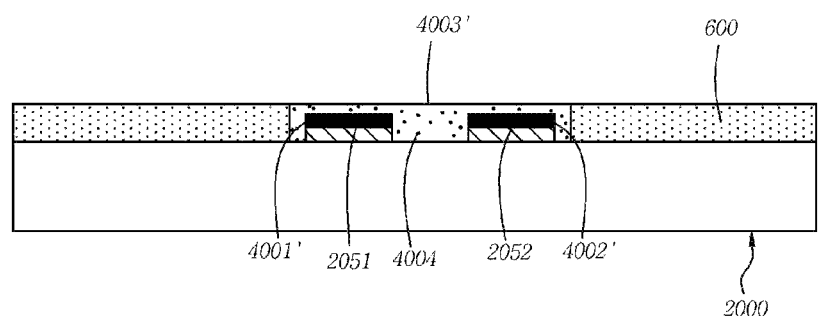

[FIG. 24]
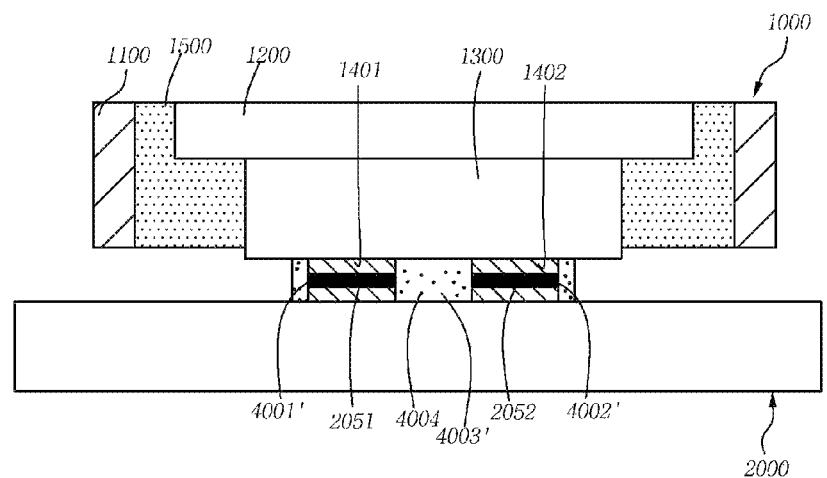
[FIG. 25]
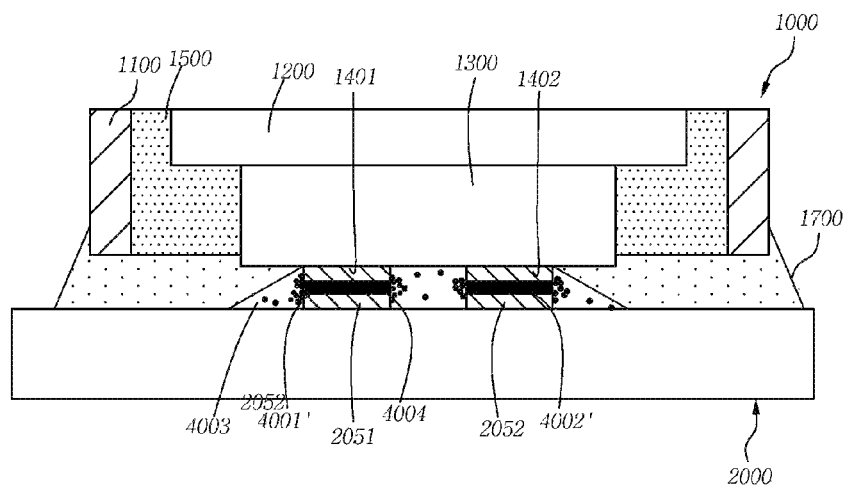

QUANTUM DOT LED PACKAGE AND QUANTUM DOT LED MODULE INCLUDING THE SAME

TECHNICAL FIELD

The present invention relates to a quantum dot LED package and a quantum dot LED module including the same.

BACKGROUND ART

Technologies for converting light of a particular color into light of a different color are well known in the field of LEDs. For example, a white LED package is known in which an LED chip emitting light of a particular wavelength or color is combined with a phosphor converting the wavelength of the light emitted from the LED chip to achieve white light emission. However, such conventional LED packages using phosphors have limitations in achieving high color gamut.

In this connection, a great deal of attempts and research have recently been made to replace phosphors with quantum dots (QDs) emitting light of different wavelengths depending on their particle size. Quantum dots have excellent wavelength conversion characteristics due to their quantum confinement effect, unlike bulk particles. However, quantum dots tend to lose their performance because of their high susceptibility to external environmental conditions such as heat, moisture, and oxygen. For this reason, the application of wavelength converting materials, including quantum dots, without modification to conventional LED packages causes many problems.

Particularly, since wavelength converting materials such as quantum dots are vulnerable to heat generated from LED chips, heat dissipating reflectors such as metal reflectors are used to dissipate heat generated during operation of LED chips. However, the dissipation paths of heat generated from LED chips are blocked by general heat dissipating reflectors that are upwardly open and downwardly closed, causing poor heat dissipating characteristics.

On the other hand, there has been proposed an LED module including a bendable PCB based on an Al plate and quantum dot LED packages mounted on the bendable PCB. However, there is a considerable difference in thermal resistivity between the LED packages of the LED module, resulting in a large difference in the lifetime of the LED packages. This is because the thermal reliability of the LED chips is determined by the difference in thermal resistivity. When a few ones of the LED packages of the quantum dot LED module are defective, all LED packages cannot be used any longer. Thus, the LED packages of the LED module needs to be maintained in a thermal equilibrium state such that heat is transferred from the relatively high temperature LED packages to the relatively low temperature LED packages to reduce a difference in the reliability of the LED packages. Another problem of the quantum dot LED module is that the Al reduces the lifetime of the quantum dots and tends to discolor the quantum dots due to its poor heat dissipation performance.

DETAILED DESCRIPTION OF THE INVENTION

Technical Tasks

One object of the present invention is to provide a quantum dot LED package that can effectively protect quantum dots from external environmental conditions, is excellent in heat dissipation performance, has a compact structure, and is reliable.

A further object of the present invention is to provide a quantum dot LED module that reduces a difference in the lifetime of quantum dot LED packages, which may be caused when the quantum dot LED packages are far from thermal equilibrium.

Another object of the present invention is to provide a quantum dot LED module that uses a bendable Cu PCB with good heat dissipation performance mounted with quantum dot LED packages instead of a bendable Al PCB to prevent the quantum dot LED packages from being easily detached from the highly bendable Cu PCB.

Technical Solutions

A quantum dot LED package according to one aspect of the present invention includes: a reflector having a through cavity therein; a quantum dot plate accommodated in the upper portion of the through cavity; an LED chip accommodated in the lower portion of the through cavity, located on the lower surface of the quantum dot plate, and having electrode pads disposed on the bottom surface thereof; and a resin part formed in the through cavity to fix between the LED chip and the reflector and between the quantum dot plate and the reflector, wherein the reflector has at least two outwardly extending lateral protrusions by which a recess is defined.

According to one embodiment, the lateral protrusions are formed on both opposite side surfaces of the reflector.

According to one embodiment, the upper surface of the quantum dot plate lies in the same plane as the upper surface of the reflector.

According to one embodiment, the electrode pads protrude more downward than the lower surface of the reflector.

According to one embodiment, the lower surface of the LED chip is located below the lower surface of the reflector.

According to one embodiment, the reflector may be a metal reflector separated from a metal patterned frame.

According to one embodiment, the resin part may include a reflective material.

According to one embodiment, the area of the light emitting surface of the quantum dot plate may be larger than the contact area of the quantum dot plate with the LED chip.

A quantum dot LED module according to a further aspect of the present invention includes: a bendable PCB; and a plurality of quantum dot LED packages arrayed on the bendable PCB and each of which including a heat dissipating reflector having a through cavity therein, a quantum dot plate accommodated in the upper portion of the through cavity, an LED chip accommodated in the lower portion of the through cavity, located on the lower surface of the quantum dot plate, and having a first electrode pad and a second electrode pad disposed on the bottom surface thereof, and a resin part formed in the through cavity to fix between the LED chip and the reflector and between the quantum dot plate and the reflector, wherein the reflector has at least two outwardly extending lateral protrusions by which a recess is defined and the recesses of the adjacent reflectors abut each other to form a space filled with a heat dissipating material.

According to one embodiment, the lateral protrusions are formed on both opposite side surfaces of the reflector.

According to one embodiment, an opening is formed by a gap between the adjacent reflectors to open the space in the lateral directions and the heat dissipating material is diffused into locations covering the side surfaces of the reflectors through the opening.

According to one embodiment, the heat dissipating material is diffused between the LED chip and the bendable PCB and between the side surfaces of the reflector and the bendable PCB through the lower portion of the space.

According to one embodiment, one or more Zener diodes are arranged in the space.

According to one embodiment, the bendable PCB includes a heat dissipating metal layer formed of Cu or its alloy, an electrode layer formed with first electrodes corresponding to the first electrode pads and second electrodes corresponding to the second electrode pads, and an intermediate layer interposed between the electrode layer and the heat dissipating metal layer.

According to one embodiment, the first electrode pad and the second electrode pad protrude more downward than the lower surface of the reflector.

According to one embodiment, the quantum dot LED module further includes first solder joints through which the first electrode pads are bonded to the first electrodes, second solder joints through which the second electrode pads are bonded to the second electrodes, and reinforcing resin parts reinforcing the bonding state of the first electrode pads and the first electrodes through the first solder joints and the bonding state of the second electrode pads and the second electrodes through the second solder joints.

According to one embodiment, both the first solder joints and the second solder joints are embedded in the reinforcing resin parts.

According to one embodiment, the reinforcing resin parts are formed using a resin material mixed with solder balls, and the first solder joints and the second solder joints are formed using a solder cream.

According to one embodiment, the reflector may be a metal reflector separated from a metal patterned frame.

According to one embodiment, the area of the light emitting surface of the quantum dot plate may be larger than the contact area of the quantum dot plate with the LED chip.

A method for manufacturing a quantum dot LED package according to another aspect of the present invention includes (A) preparing a metal patterned frame having a plurality of through cavities, (B) accommodating quantum dot plates and LED chips attached to the quantum dot plates in the through cavities, each of which is closed at one end by a base sheet, (C) forming resin parts to fix the LED chips and the quantum dot plates in the corresponding through cavities to construct an LED package plate, and (D) separating quantum dot LED packages, each of which includes the LED chip, the quantum dot plate, and a metal reflector, from the LED package plate.

According to one embodiment, step (A) includes patterning a metal plate and the pattern includes a plurality of unit reflector patterns, each of which consists of the corresponding through cavity and a pair of peripheral holes located at both sides of the through cavity.

According to one embodiment, step (D) includes cutting the metal patterned frame such that each of the peripheral holes is divided into two sections, to form metal reflectors, each of which has a pair of recesses opposite to each other through the corresponding through cavity.

According to one embodiment, step (B) includes attaching the quantum dot plates to the base sheet such that the quantum dot plates are accommodated in the corresponding through cavities and attaching the LED chips to the corresponding quantum dot plates attached to the base sheet.

According to one embodiment, step (B) includes attaching the LED chips to the corresponding quantum dot plates and attaching the quantum dot plates attached with the LED chips to the base sheet such that the quantum dot plates and the LED chips are accommodated in the corresponding through cavities.

According to one embodiment, each of the quantum dot plates is attached to the base sheet through one end of the corresponding through cavity and each of the LED chips has electrode pads disposed on the bottom surface thereof and exposed to the outside through the other end of the through cavity.

According to one embodiment, step (D) includes punching the LED package plate attached to the base sheet to separate quantum dot LED packages and detaching the quantum dot LED packages from the base sheet.

A method for fabricating a quantum dot LED module according to yet another aspect of the present invention includes: manufacturing quantum dot LED packages; preparing a bendable PCB; and mounting the quantum dot LED packages on the bendable PCB, wherein the step of manufacturing quantum dot LED packages includes (A) preparing a metal patterned frame having a plurality of through cavities, (B) accommodating quantum dot plates and LED chips attached to the quantum dot plates in the through cavities, each of which is closed at one end by a base sheet, (C) forming resin parts to fix the LED chips and the quantum dot plates in the through cavities to construct an LED package plate, and (D) separating quantum dot LED packages, each of which includes the LED chip, the quantum dot plate, and a metal reflector, from the LED package plate.

According to one embodiment, the bendable PCB includes a heat dissipating metal layer, an electrode layer formed with first electrodes corresponding to first electrode pads and second electrodes corresponding to second electrode pads, and an intermediate layer interposed between the electrode layer and the heat dissipating metal layer.

According to one embodiment, the step of mounting quantum dot LED packages on the bendable PCB includes (a) applying a first solder cream and a second solder cream to the first electrodes and the second electrodes, respectively, (b) applying a flowable resin to cover both the first solder cream and the second solder cream, (c) arranging the quantum dot LED packages on the bendable PCB such that the first solder cream is placed between the first electrode pads and the first electrodes and the second solder cream is placed between the second electrode pads and the second electrodes, and (d) heating the flowable resin, the first solder cream, and the second solder cream to form first solder joints bonding the first electrode pads to the first electrodes, second solder joints bonding the second electrode pads to the second electrodes, and reinforcing resin parts reinforcing the bonding state of the first electrode pads and the first electrodes through the first solder joints and the bonding state of the second electrode pads and the second electrodes through the second solder joints.

According to one embodiment, the flowable resin includes a plurality of solder balls and the solder balls are collected close to the first solder joints and the second solder joints during heating in step (d).

According to one embodiment, step (a) includes arranging a primary mask, which has first openings through which the first electrodes are exposed and second openings through which the second electrodes are exposed, on the bendable PCB and applying the first solder cream and the second solder cream through the first openings and the second openings, respectively.

According to one embodiment, step (b) includes removing the primary mask, arranging a secondary mask, which has openings through which both the first electrodes and the second electrodes are exposed, on the bendable PCB and applying a flowable resin through the openings so as to cover both the first solder cream and the second solder cream.

According to one embodiment, step (A) includes patterning a metal plate and the pattern includes a plurality of unit reflector patterns, each of which consists of the corresponding through cavity and a pair of elongated peripheral holes located at both sides of the through cavity.

According to one embodiment, step (D) includes cutting the patterned frame such that each of the peripheral holes is divided into two sections, to form metal reflectors, each of which has a pair of recesses opposite to each other through the corresponding through cavity.

According to one embodiment, the method further includes filling a heat dissipating material between the adjacent metal reflectors of the adjacent quantum dot LED packages mounted on the bendable PCB.

According to one embodiment, the heat dissipating material is filled in a space defined by recesses formed on the facing side surfaces of the adjacent metal reflectors.

According to one embodiment, an opening is formed by a gap between the adjacent reflectors to open the space in the lateral directions and the heat dissipating material is diffused into locations covering the side surfaces of the reflectors through the opening.

According to one embodiment, the heat dissipating material is diffused between the LED chip and the bendable PCB and between the side surfaces of the reflector and the bendable PCB through the lower portion of the space.

According to one embodiment, one or more Zener diodes are arranged in the space.

Effects of the Invention

The quantum dot LED package of the present invention can effectively protect quantum dots from external environmental conditions, is excellent in heat dissipation performance, has a compact structure, and is reliable.

The quantum dot LED module of the present invention includes a PCB and a plurality of quantum dot LED packages mounted on the PCB and reduces a difference in the lifetime of the quantum dot LED packages, which may be caused when the quantum dot LED packages are far from thermal equilibrium.

The quantum dot LED module of the present invention uses a bendable Cu PCB with good heat dissipation performance mounted with quantum dot LED packages instead of a bendable Al PCB to prevent the quantum dot LED packages from being easily detached from the highly bendable Cu PCB.

BRIEF DESCRIPTION OF THE DRAWINGS

FIG. 1 is a plan view illustrating a quantum dot LED package according to one embodiment of the present invention.

FIG. 2 is a bottom view illustrating a quantum dot LED package according to one embodiment of the present invention.

FIG. 3 is a cross-sectional view taken along line A-A of FIG. 1.

FIG. 4 is a cross-sectional view illustrating an exemplary quantum dot plate.

FIGS. 5 to 16 illustrate a method for manufacturing a quantum dot LED package according to one embodiment of the present invention.

FIG. 17 is a plan view illustrating a quantum dot LED module according to one embodiment of the present invention.

FIG. 18 is a cross-sectional view taken along line B-B of FIG. 17.

FIG. 19 is a cross-sectional view taken along line C-C of FIG. 17.

FIGS. 20 to 25 illustrate the mounting of a quantum dot LED package on a PCB in a method for fabricating a quantum dot LED module according to one embodiment of the present invention.

BEST MODE FOR CARRYING OUT THE INVENTION

Preferred embodiments of the present invention will now be described with reference to the accompanying drawings.

FIGS. 1 and 2 are a plan view and a bottom view illustrating a quantum dot LED package according to one embodiment of the present invention, respectively, and FIG. 3 is a cross-sectional view taken along line A-A of FIG. 1.

Referring to FIGS. 1 to 3, the quantum dot LED package 1000 includes a metal reflector 1100 having a through cavity 1101, a quantum dot plate 1200 accommodated in the upper portion of the through cavity, an LED chip 1300 accommodated in the lower portion of the through cavity 1101 and whose top surface is coupled to the lower surface of the quantum dot plate 1200, a pair of electrode pads 1400 consisting of a first electrode pad 1401 and a second electrode pad 1402 disposed on the lower surface of the LED chip 1300, and a resin part 1500 filled in the through cavity 1101 to fix between the LED chip 1300 and the reflector 1100 and between the quantum dot plate 1200 and the metal reflector 1100.

In this embodiment, the metal reflector 1100 is made of a metal with good heat dissipation performance. The metal reflector 1100 may be separated from a metal patterned frame by cutting.

The metal reflector 1100 includes: a pair of recesses 1102 formed on its side surfaces, i.e. right and left side surfaces when viewed from the top, opposite to each other through the through cavity 1101 and directed toward the right and left directions, respectively; and lateral protrusions 1103 defining the corresponding recesses 1102 on the right and left side surfaces. The lateral protrusions 1103 are formed in pairs on both side surfaces of the metal reflector 1100. That is, the lateral protrusions 1103 are provided in two pairs for each metal reflector 1100. Each of the recesses 1102 is defined by the corresponding pair of lateral protrusions 1103. In other words, one of the recesses 1102 is formed between the pair of lateral protrusions 1103 formed on one side surface of the metal reflector 1100 and the other recess 1102 is formed between the other pair of lateral protrusions 1103 formed on the other side surface of the metal reflector 1100.

Each of the recesses 1102 is formed over the entire height from the upper end to the lower end of the metal reflector 1100. When the metal reflector 1100 is arrayed with another metal reflector in a row, the adjacent recesses 1102 abut each other between the adjacent metal reflectors 1100 to define a space extending from the upper ends to the lower ends of the metal reflectors 1100. The space is filled with a heat dissipating material, which will be more specifically described below.

The quantum dot plate 1200 may have a structure in which a quantum dot layer is interposed between a first light transmitting plate and a second light transmitting plate, which will be specifically described below. Alternatively, the quantum dot plate 1200 may have another structure. The quantum dot plate 1200 includes an upper surface and a lower surface.

Although not specifically illustrated, the LED chip 1300 may include a stack structure including a p-type semiconductor layer, an n-type semiconductor layer, and an active layer formed between the two semiconductor layers. This structure is well known in the art. The LED chip 1300 includes an upper surface as a light emitting surface and a lower surface opposite to the upper surface. The upper surface may be one surface of a transparent sapphire substrate on which the semiconductor stack structure grows. As mentioned previously, the first electrode pad 1401 and the second electrode pad 1402 are disposed on the lower surface of the LED chip 1300. The levels of the upper surfaces of the first electrode pad 1401 and the second electrode pad 1402 in contact with the lower surface of the LED chip 1300 may be different from each other but the levels of the lower surfaces of the first electrode pad 1401 and the second electrode pad 1402 bonded to electrodes of a PCB are preferably the same. The first electrode pad 1401 and the second electrode pad 1402 protrude more downward than the lower surface of the metal reflector 1100. To this end, the bottom of the LED chip 1300 is preferably designed to protrude more downward than the lower surface of the metal reflector 1100.

Light is emitted through the upper surface of the quantum dot plate 1200 and the upper surface of the LED chip 1300, through which light is emitted, is attached to the lower surface of the quantum dot plate 1200. The upper surface and the lower surface of the quantum dot plate 1200 have the same area and the contact area of the lower surface of the quantum dot plate 1200 with the upper surface of the LED chip 1300 is determined to be smaller than the area of the upper surface of the quantum dot plate 1200 through which light is emitted. Upper gaps exist between the side surfaces of the quantum dot plate 1200 and the inner walls of the through cavity 1101 and lower gaps exist between the side surfaces of the LED chip 1300 and the inner walls of the through cavity 1101. The lower gaps are greater than the upper gaps. The upper surface of the quantum dot plate 1200 lies in the same plane as the upper surface of the metal reflector 1100. This increases the luminous efficiency of the quantum dot LED package 1000 and makes the quantum dot LED package compact in structure.

On the other hand, the resin part 1500 is formed by filling a flowable resin in the through cavity 1101 to make up the upper gaps and the lower gaps. The resin part 1500 serves to fix between the LED chip 1300 and the metal reflector 1100 and between the quantum dot plate 1200 and the metal reflector 1100. The resin part 1500 is preferably a reflective resin part formed by filling a resin mixed with a reflective material such as $TiO_2$ or $SiO_2$ in the through cavity 1101 and molding the filled resin. More specifically, the resin part 1500 is a resin-made white wall. The resin-made white wall reflects light emitted from the side surfaces of the LED chip 1300 and induces the reflected light in a direction so as to pass through the quantum dot plate 1200. The majority of light emitted from the upper surface of the LED chip 1300 is directed toward the quantum dot plate 1200.

FIG. 4 is a cross-sectional view illustrating an example of the quantum dot plate.

Referring to FIG. 4, the exemplary quantum dot plate 1200 includes a first light transmitting plate 1210, a second light transmitting plate 1230, and a quantum dot layer 1220 interposed between the two light transmitting plates 1210 and 1230. The quantum dot layer 1220 includes quantum dots that convert the wavelength of light depending on their particle size. The quantum dot layer 1220 may be formed by mixing or dispersing quantum dots in a matrix material, for example, an acrylate polymer, an epoxy polymer or a combination thereof. Quantum dots are semiconductor nanoparticles that are a few nanometers (nm) in diameter. Quantum dots possess quantum mechanical properties such as quantum confinement effects. Here, the quantum confinement effect refers to a phenomenon in which when the size of semiconductor nanoparticles decreases, the band gap energy of the semiconductor nanoparticles increases (conversely, the wavelength of light from the semiconductor nanoparticles decreases). Quantum dots prepared by a chemical synthesis process can achieve desired colors simply by varying their particle size without changing the materials. Quantum dots may be composed of Group II-VI, III-V, and IV materials, specifically CdSe, CdTe, CdS, ZnSe, ZnTe, ZnS, InP, GaP, $GaInP_2$, PbS, ZnO, $TiO_2$, AgI, AgBr, $Hg_{12}$, PbSe, $In_2S_3$, $In_2Se_3$, $Cd_3P_2$, $Cd_3As_2$, and GaAs. Quantum dots may have a core-shell structure. Here, the core may include a material selected from the group consisting of CdSe, CdTe, CdS, ZnSe, ZnTe, ZnS, HgTe, and HgS and the shell include a material selected from the group consisting of CdSe, CdTe, CdS, ZnSe, ZnTe, ZnS, HgTe, and HgS.

The first light transmitting plate 1210 may be made of a highly weldable or bondable light transmitting material, preferably a glass material. The first light transmitting plate 1210 may include a cavity 1211 on the top surface thereof. The quantum dot layer 1220 is accommodated in the cavity 1211. A suitable process may be used to form the cavity 1211 on the top surface of the first light transmitting plate 1210. Examples of such processes include mechanical processes, chemical processes, and assembly processes. According to a mechanical process, the cavity 1211 is formed by cutting the top surface of the first light transmitting plate 1210 with a grinder. According to a chemical process, the cavity 1211 is formed by etching the top surface of the first light transmitting plate 1210 using an etchant and a mask. According to an assembly process, the cavity 1211 is formed by welding several smaller glass pieces to one larger glass piece with a laser except an area where the cavity is to be formed. The second light transmitting plate 1230 is coupled to the upper surface of the first light transmitting plate 1210 to cover the quantum dot layer 1220 in a state in which the quantum dot layer 1220 is accommodated in the cavity 1211, completing the construction of the quantum dot plate 1200. The first light transmitting plate 1210 and the second light transmitting plate 1230 can be bonded to each other by irradiating a femto laser beam onto the area where the first light transmitting plate 1210 and the second light transmitting plate 1230 meets each other. The wavelength of the femto laser beam is predetermined using a laser system. The first light transmitting plate 1210 and the second light transmitting plate 1230 are melted in the area irradiated with the femto laser beam. As a result of the subsequent hardening, the first light transmitting plate 1210 and the second light transmitting plate 1230 are bonded to each other. In this embodiment, the quantum dot layer 1220 is placed in the cavity 1211 formed on the top surface of the first light transmitting plate 1210 and the second light transmitting plate 1230 closes the cavity 1211. This arrangement enables the quantum dot plate 1200 to be reliably sealed. However, the structure of the quantum dot plate is not particularly limited. For example, the quantum dot plate may have a structure in which the quantum dot layer is interposed between the two light transmitting plates without the need for a cavity.

Now, a method for manufacturing a quantum dot LED package according to one embodiment of the present invention will be described.

Referring first to FIGS. 5 and 6, a metal patterned frame 1100' having a plurality of through cavities 1101 is prepared. For convenience of understanding, only a portion of the metal patterned frame is enlarged in FIGS. 5 and 6.

The metal patterned frame 1100' is prepared by patterning a metal plate with high thermal conductivity and reflectivity, for example, a plate made of aluminum or its alloy. The metal plate can be patterned by chemical processing such as etching or laser machining. The pattern may include a plurality of unit reflector patterns 110' arrayed in a matrix. Each of the unit reflector patterns 110' includes a through cavity 1101 and a pair of peripheral holes 1102' formed at both sides of the through cavity 1101 (see the box indicated by alternate long and two short dashes lines). Each of the peripheral holes 1102' is formed between a pair of connection portions 1103' connecting the unit reflector patterns 110' adjacent to each other in the widthwise direction. The through cavities 1101 and the peripheral holes 1102' are open upward and downward such that they have the same depth as the height of the metal patterned frame 1100'.

Referring to FIGS. 7 and 8, a base sheet 200 made of a transparent silicone material is attached to one side of the metal patterned frame 1100' to close one side of each of the through cavities 1101 of the metal patterned frame 1100'. Thus, one side of each of the through cavities 1101 of the metal patterned frame 1100' is closed and only the other side is open. The base sheet 200 may be a transparent silicone sheet. A rigid frame (not illustrated) may surround the edges of the base sheet 200 to tightly maintain the base sheet 200.

Referring next to FIGS. 9 and 10, quantum dot plates 1200 are accommodated in the corresponding through cavities 1101, each of which is closed at one end by the base sheet 200, by attaching the quantum dot plates 1200 to the surface of the base sheet 200 through the through cavities 1101. Referring next to FIGS. 11 and 12, LED chips 1300 are attached to the quantum dot plates 1200 attached to the base sheet 200. The construction of the quantum dot plates 1200 is the same as that described above. The LED chips 1300 may have the same structure as described above. That is, electrode pads consisting of a first electrode pad 1401 connected to a first conductive semiconductor layer and a second electrode pad 1402 connected to a second conductive semiconductor layer are disposed on one surface of each of the LED chips 1300, and light is emitted from the other surface of the LED chip 1300. The light emitting surface of each of the LED chips 1300 is in contact with the corresponding quantum dot plate 1200, and the first electrode pad 1401 and the second electrode pad 1402 protrude outward from the corresponding through cavity 1101. To this end, the sum of the thickness of the quantum dot plate 1200, the thickness of the LED chip 1300, and the thickness of the first or second electrode pad 1401 or 1402 (hereinafter collectively denoted by reference numeral 1400) is determined to be larger than the depth of the corresponding through cavity 1101.

After the quantum dot plates are attached to the base sheet, the LED chips are attached to the quantum dot plates. Alternatively, the quantum dot plates attached with the LED chips may be attached to the base sheet by placing them in the through cavities.

Referring next to FIGS. 13 and 14, resin parts 1500 are formed to fix the LED chips 1300 and the quantum dot plates 1200 in the through cavities, completing the construction of an LED package plate 1000' which includes the metal patterned frame 1100' including the plurality of through cavities, the LED chips 1300 and the quantum dot plates 1200 accommodated in the through cavities, and the resin parts 1500 fixing the LED chips 1300 and the quantum dot plates 1200 to the metal patterned frame 1100'. The resin parts 1500 may be formed using a resin mixed with a reflective material such as $TiO_2$ or $SiO_2$. The resin parts 1500 are preferably white walls formed by filling an epoxy resin in the through cavities 1101 and molding the epoxy resin. The surface of each of the resin parts 1500 in contact with the base sheet 200 lies in the same plane as one surface of a corresponding metal reflector in contact with the base sheet 200 and one surface of the corresponding quantum dot plate 1200 in contact with the base sheet 200. The other surface of the metal reflector lies in the same plane as the other surface of the resin part 1500. The electrode pads 1401 and 1402 (hereinafter collectively denoted by reference numeral 1400) protrude beyond the other surface of the resin part 1500.

After the construction of the LED package plate 1000' is completed, the LED package plate 1000' (see FIGS. 13 and 14) is cut by punching to separate a plurality of quantum dot LED packages 1000, as illustrated in FIGS. 15 and 16. Each of the separated quantum dot LED packages 1000 includes the LED chip 1300, the quantum dot plate 1200, and the metal reflector 1100. The separation of the plurality of quantum dot LED packages 1000 from the LED package plate 1000' (see FIGS. 13 and 14) is performed by punching the LED package plate 1000' (see FIGS. 13 and 14) attached to the base sheet 200. Even after the quantum dot LED packages 1000 are separated from the LED package plate 1000' (see FIGS. 13 and 14) by punching, they remain attached to the base sheet 200. Accordingly, the quantum dot LED packages 1000 need to be detached from the base sheet 200.

During the separation of the quantum dot LED packages 1000 from the LED package plate 1000' (see FIGS. 13 and 14) by punching, the metal patterned frame 1000' (see FIGS. 13 and 14) is cut such that each of the peripheral holes 1102' (see FIGS. 13 and 14) is divided into two sections. In other words, when the metal patterned frame 1000' is cut, each of the connection portions 1103' connecting the unit reflector patterns adjacent to each other in the widthwise direction is divided into two sections and each of the peripheral holes 1102' (see FIGS. 13 and 14) formed between the connection portions 1103' is also divided into two sections, with the result that pairs of recesses 1102 and lateral protrusions 1103 defining the recesses 1102 are formed in the vicinity of the through cavities filled with the resin parts 1500. Each of the lateral protrusions 1103 is a portion remaining after the corresponding connection portion 1103' is divided into two sections.

As mentioned previously, the lateral protrusions 1103 are formed in pairs on both side surfaces of each of the metal reflectors 1100. Each of the recesses 1102 is defined by the corresponding pair of lateral protrusions 1103. In other words, one of the recesses 1102 is formed between the pair of lateral protrusions 1103 formed on one side surface of the corresponding metal reflector 1100 and the other recess 1102 is formed between the other pair of lateral protrusions 1103 formed on the other side surface of the metal reflector 1100.

Now, a description will be given of a quantum dot LED module that can be fabricated using the quantum dot LED packages 1000.

FIG. 17 is a plan view illustrating a quantum dot LED module according to one embodiment of the present invention and FIGS. 18 and 19 are cross-sectional views taken along lines B-B and C-C of FIG. 17, respectively.

Referring to FIGS. 17 to 19, the quantum dot LED module includes a bendable PCB 2000 and a plurality of quantum dot LED packages 1000 arrayed on the bendable PCB 2000.

The bendable PCB 2000 includes a heat dissipating metal layer 2010 formed of Cu or its alloy, an electrode layer 2050 formed with first electrodes 2051 and second electrodes 2052 corresponding to first electrode pads 1401 and second electrode pads 1402 of the quantum dot LED packages 1000, and an intermediate layer 2030 interposed between the electrode layer 2050 and the heat dissipating metal layer 2010. Hereinafter, the first and second electrode pads 1401 and 1402 are collectively denoted by reference numeral 1400. The intermediate layer 2030 includes a first adhesive layer 2031 interposed between an electrically insulating core layer 2032 and the heat dissipating metal layer 2010 and a second adhesive layer 2033 interposed between the electrically insulating core layer 2032 and the electrode layer 2050. In this embodiment, the bendable Cu PCB 2000 includes a 0.5 mm thick heat dissipating metal layer 2010 formed of a Cu alloy, a 10 μm thick first adhesive layer 2031 on the heat dissipating metal layer 2010, a 25 μm thick a PI film layer as an electrically insulating core layer 2032 on the first adhesive layer 2031, a 10 μm thick second adhesive layer 2033 on the electrically insulating core layer 2032, and an electrode layer 2050 formed of Cu or its alloy on the second adhesive layer 2033.

The bendable Cu PCB is based on the heat dissipating metal layer 2010 formed of a Cu alloy and has advantages in almost all aspects compared to a bendable PCB prepared under the same conditions as those used for the preparation of the bendable Cu PCB except that an Al alloy is used as a base material instead of a Cu alloy. Particularly, the use of a bendable Al PCB including a heat dissipating metal layer formed of an Al alloy results in severe browning of a quantum dot plate of quantum dot LED packages mounted on the bendable Al PCB due to poor heat dissipating characteristics of the bendable Al PCB. In contrast, the use of the bendable Cu PCB 2000 as in this embodiment keeps a quantum dot plate from browning due to good heat dissipating characteristics of the bendable Cu PCB 2000. The quantum dot LED packages 1000 may be easily peeled off from the highly bendable Cu PCB 2000. This problem is solved by the provision of an additional structure to reinforce the bonding strength between the electrode pads 1400 of the quantum dot LED packages 1000 and the electrodes 2051 and 2052 (hereinafter collectively denoted by reference numeral 205) of the bendable Cu PCB 2000. This additional structure and its formation will be more specifically described below.

As mentioned previously, each of the quantum dot LED packages 1000 arrayed on the bendable PCB 2000 includes a metal reflector 1100 having a through cavity 1101, a quantum dot plate 1200 accommodated in the upper portion of the through cavity 1101, an LED chip 1300 accommodated in the lower portion of the through cavity 1101 and whose top surface is attached to the lower surface of the quantum dot plate 1200, a first electrode pad 1401 and a second electrode pad 1402 disposed on the lower surface of the LED chip 1300 and protruding more downward than the lower surface of the metal reflector 1100, and a reflective resin part 1500 formed in the through cavity 1101 to fix between the LED chip 1300 and the metal reflector 1100 and between the quantum dot plate 1200 and the metal reflector 1100.

Recesses 1102 are formed on both opposite side surfaces of the metal reflector 1100. The recesses 1102 of the two adjacent metal reflectors 1100 of the two adjacent quantum dot LED packages 1000 abut each other to define a space in which a heat dissipating material 1700 is filled.

The adjacent metal reflectors 1100 are spaced a predetermined gap g from each other. An opening is formed by this gap to laterally open the space in which the heat dissipating material 1700 is filled. The heat dissipating material 1700 may be diffused into locations covering the side surfaces of the metal reflectors 1100 through the opening formed by the gap. The heat dissipating material 1700 may be diffused between the LED chips 1300 and the bendable PCB 200 and between the reflectors 1100 and the bendable PCB 200 through the lower portion of the space. Lateral protrusions 1103 are formed in pairs on both side surfaces of each of the metal reflectors 1100. That is, the lateral protrusions 1103 are provided in two pairs for each metal reflector. Each of the recesses 1102 is defined by the corresponding pair of lateral protrusions 1103. In other words, one of the recesses 1102 is formed between the pair of lateral protrusions 1103 formed on one side surface of the metal reflector 1100 and the other recess 1102 is formed between the other pair of lateral protrusions 1103 formed on the other side surface of the metal reflector 1100.

One or more Zener diodes 3000 are arranged in the space. In this embodiment, two Zener diodes 3000 are arranged in the space between the two quantum dot LED packages 1000 to protect the two LED chips 1300 of the two adjacent quantum dot LED packages 1000.

The quantum dot LED module further includes first solder joints 4001 bonding the first electrode pads 1401 to the corresponding first electrodes 2051, second solder joints 4002 bonding the second electrode pads 1402 to the corresponding second electrodes 2052, and reinforcing resin parts 4003 reinforcing the bonding state of the first electrode pads 1401 and the first electrodes 2051 through the first solder joints 4001 and the bonding state of the second electrode pads 1402 and the second electrodes 2052 through the second solder joints 4002. The quantum dot LED packages 1000 are likely to be peeled off from the bendable Cu PCB 2000 because of the high bendability of the bendable Cu PCB 2000, as mentioned previously, and the resulting damage to the first solder joints 4001 and/or the second solder joints 4002. The reinforcing resin parts 4003 serve to reduce or prevent peeling off of the quantum dot LED packages 1000 from the bendable Cu PCB 2000.

Here, both the first solder joint 4001 and the second solder joint 4002 are embedded in each of the reinforcing resin parts 403. Furthermore, the first electrode pad 1401 and the first electrode 2051 together with the first solder joint 4001 are embedded in the reinforcing resin part 4003. The second electrode pad 1402 and the second electrode 2052 together with the second solder joint 4002 are also embedded in the reinforcing resin part 4003. This embedment ensures more reliable reinforcement of the bonding state of the first electrode pads 1401 and the first electrodes 2051 through the first solder joints 4001 and the bonding state of the second electrode pads 1402 and the second electrodes 2052 through the second solder joints 4002.

The reinforcing resin parts 4003 are formed using a resin material (preferably an epoxy resin) mixed with solder balls 4004 and the first solder joints and the second solder joints are formed using a solder cream. The solder cream is melted when heated and is then hardened to form the first solder joints 4001 and the second solder joints 4002. The epoxy resin is melted when heated and is then hardened to form the reinforcing resin parts 4003 reinforcing the first solder joints 4001 and the second solder joints 4002. The plurality of solder balls 4004 contained in the resin material are moved in the direction toward the first solder joints 4001 and the second solder joints 4002 and are collected close to the first solder joints 4001 and the second solder joints 4002 during heating to improve the bondability between the first electrode pads 1401 and the first electrodes 2051 and the bondability between the second electrode pads 1402 and the second electrodes 2052.

Now, a method for fabricating the quantum dot LED module will be described.

First, a bendable PCB 2000 based on a heat dissipating metal layer of Cu or its alloy and a plurality of quantum dot LED packages 1000 mounted on the bendable PCB 2000 are prepared. The quantum dot LED packages 1000 are manufactured in the same manner as already described above. As described above, the bendable PCB 2000 includes: a heat dissipating metal layer; an electrode layer formed with first electrodes 2051 and second electrodes 2052 corresponding to first electrode pads 1401 and second electrode pads 1402 of the quantum dot LED packages 1000, respectively; and an intermediate layer 2030 interposed between the electrode layer 2050 and the heat dissipating metal layer 2010.

The quantum dot LED packages 1000 are mounted on the bendable PCB 2000, as illustrated in FIGS. 20 to 25.

Referring first to FIG. 20, a primary mask 500 formed with first openings 501, through which the first electrodes 2051 are exposed, and second openings 502, through which the second electrodes 2052 are exposed, is arranged on the bendable PCB 2000.

Referring next to FIG. 21, a first solder cream 4001' and a second solder cream 4002' are applied to the first electrodes 2051 and the second electrodes 2052 through the first openings 501 and the second openings 502, respectively. The first solder cream 4001' and the second solder cream 4002' are represented by different reference numerals to distinguish that they are applied to the first electrodes 2051 and the second electrodes 2052, respectively. Indeed, the first solder cream 4001' and the second solder cream 4002' are portions of the same solder cream applied onto the primary mask 500. The first solder cream 4001' is a portion of the solder cream applied onto the first electrodes 2051 through the first openings 501 (see FIG. 20) and the second solder cream 4002' is a portion of the solder cream applied onto the second electrodes 2052 through the second openings 502 (see FIG. 20).

Next, the primary mask 500 is removed. Thereafter, a secondary mask 600 is arranged on the bendable PCB 2000, as illustrated in FIG. 22. The secondary mask 600 is formed with extended openings 601 through which the first electrodes 2051, the first solder cream 4001' applied onto the first electrodes 2051, the second electrodes 2052, and the second solder cream 4002' applied onto the second electrodes 2052 are all exposed.

Referring next to FIG. 23, a flowable resin 4003' is applied through the extended openings 601 (see FIG. 22) to cover both the first solder cream 4001' and the second solder cream 4002'. A plurality of micro-sized solder balls 4004 are mixed in the flowable resin 4003'. The flowable resin 4003' is preferably an epoxy resin.

Referring next to FIG. 24, the secondary mask is removed and quantum dot LED packages 1000 are arranged on the bendable PCB 2000 such that the first solder cream 4001' is interposed between the first electrode pads 1401 and the first electrodes 2501 and the second solder cream 4002' is interposed between the second electrode pads 1402 and the second electrodes 2502.

Then, the flowable resin 4003', the first solder cream 4001', and the second solder cream 4002' are heated. As a result of this heating, the quantum dot LED packages 1000 are bonded and mounted on the bendable PCB 2000, completing the fabrication of the quantum dot LED module, as illustrated in FIG. 25. When heated, the first solder cream becomes first solder joints 4001 electrically connecting and bonding the first electrode pads 1401 to the first electrodes 2051 and the second solder cream becomes second solder joints 4002 electrically connecting and bonding the second electrode pads 1402 to the second electrodes 2052. When heated, the resin applied to cover both the first solder cream and the second solder cream becomes reinforcing resin parts 4003 reinforcing the bonding state of the first electrode pads 1401 and the first electrodes 2051 through the first solder joints 4001 and the bonding state of the second electrode pads 1402 and the second electrodes 2052 through the second solder joints 4002. The solder balls 4004 contained in the resin are collected close to the first solder joints 4001 and the second solder joints 4002 during heating to make the bonding state of the first electrode pads 1401 and the first electrodes 2051 through the first solder joints 4001 and the bonding state of the second electrode pads 1402 and the second electrodes 2052 through the second solder joints 4002 more reliable.

The quantum dot LED packages 1000 are mounted such that they are arrayed in one or more rows on the bendable PCB 2000. By the ladder-like shape of the metal reflectors 1100 well illustrated in FIG. 17, recesses 1102 are formed on the right and left side surfaces of each of the metal reflectors 1100. The recesses 1102 of the two metal reflectors 1100 of the two adjacent quantum dot LED packages 1000 abut each other to form a filling space in which a heat dissipating material 1700 is filled. A predetermined gap is formed between the adjacent metal reflectors. An opening is formed by this gap to laterally open the filling space in which the heat dissipating material is filled. One or more Zener are arranged in the filling space. The heat dissipating material filled in the filling space may be diffused to locations covering the side surfaces of the reflectors 1100 through the opening formed by the gap between the metal reflectors. The heat dissipating material 1700 may be diffused between the LED chips 1300 and the bendable PCB 2000 and between the metal reflectors 1100 and the bendable PCB 2000 through the lower portion of the space. Lateral protrusions 1103 are formed in pairs on both side surfaces of each of the metal reflectors 1100. That is, the lateral protrusions 1103 are provided in two pairs for each metal reflector. Each of the recesses 1102 is defined by the corresponding pair of lateral protrusions 1103. In other words, one of the recesses 1102 is formed between the pair of lateral protrusions 1103 formed on one side surface of the metal reflector 1100 and the other recess 1102 is formed between the other pair of lateral protrusions 1103 formed on the other side surface of the metal reflector 1100.

The heat dissipating material 1700 may be a heat dissipating coating material or resin. The heat dissipating material 1700 is required to have a thermal conductivity of at least 2 W/mK. It is preferable that the reflectivity and endurance temperature of the heat dissipating material are >88% and >120° C., respectively.

Heat dissipating reflectors made of other heat dissipating materials such as PPA, PCT or EMC may be used instead of the metal reflectors. The bonding between the heat dissipating reflectors, particularly metal reflectors, and the metal-based PCB allows heat generated from the LED chips to rapidly escape through the heat dissipating reflectors and the heat dissipating material of the PCB, with the result that thermal damage to the LED chips and circuits connected thereto can be minimized Preferably, the bendable PCB uses Cu or a Cu alloy for its heat dissipating metal layer. Alternatively, the bendable PCB may employ another structure, including an Al/CEM/FR4/BT structure. The formation of the recesses in the ladder-like structure of the metal reflectors secures spaces filled with the heat dissipating material to ensure a thermal equilibrium or balance between the quantum dot LED packages. Furthermore, these spaces can also be used for the installation of Zener diodes. It is preferable that the intervals between the adjacent quantum dot LED packages in the module, more specifically between the adjacent metal reflectors are maintained at 500 μm or more. As mentioned earlier, the use of the heat dissipating material such as a heat dissipating coating material leads to a reduction in temperature difference between the quantum dot LED packages.

EXPLANATION OF REFERENCE NUMERALS

1000: Quantum dot LED package
1100: Metal reflector (heat dissipating reflector)
1200: Quantum dot plate
1300: LED chip
1101: Through cavity
1400, 1401, 1402: Electrode pads
1500: Resin part

The invention claimed is:

1. A quantum dot LED package comprising:
a metal reflector having a through cavity therein;
a quantum dot plate accommodated in the upper portion of the through cavity;
an LED chip accommodated in the lower portion of the through cavity, located on the lower surface of the quantum dot plate, and having electrode pads disposed on the bottom surface thereof; and
a resin part filled between the side surfaces of the LED chip and the quantum dot plate and the inner walls of the through cavity in a state in which the LED chip and the quantum dot plate are accommodated in the through cavity to fix between the LED chip and the metal reflector and between the quantum dot plate and the metal reflector,
wherein the metal reflector has at least two outwardly extending lateral protrusions by which a recess is defined, the upper surface of the quantum dot plate lies in the same plane as the upper surface of the metal reflector, the lateral protrusions are formed on both opposite side surfaces of the metal reflector, and the lower surface of the LED chip is located below the lower surface of the metal reflector.

2. The quantum dot LED package according to claim 1, wherein the electrode pads protrude more downward than the lower surface of the metal reflector.

3. The quantum dot LED package according to claim 1, wherein the resin part comprises a reflective material.

4. The quantum dot LED package according to claim 1, wherein the area of the light emitting surface of the quantum dot plate is larger than the contact area of the quantum dot plate with the LED chip.

5. A quantum dot LED module comprising:
a bendable PCB; and
a plurality of quantum dot LED packages arrayed on the bendable PCB and each of which comprising a metal reflector having a through cavity therein, a quantum dot plate accommodated in the upper portion of the through cavity, an LED chip accommodated in the lower portion of the through cavity, located on the lower surface of the quantum dot plate, and having a first electrode pad and a second electrode pad disposed on the bottom surface thereof, and a resin part filled between the side surfaces of the LED chip and the quantum dot plate and the inner walls of the through cavity in a state in which the LED chip and the quantum dot plate are accommodated in the through cavity to fix between the LED chip and the metal reflector and between the quantum dot plate and the metal reflector,
wherein the metal reflector has at least two outwardly extending lateral protrusions by which a recess is defined, and the recesses of the adjacent metal reflectors abut each other to form a space, the upper surface of the quantum dot plate lies in the same plane as the upper surface of the metal reflector, the lateral protrusions are formed on both opposite side surfaces of the metal reflector, and the space is filled with a heat dissipating material.

6. The quantum dot LED module according to claim 5, wherein an opening is formed by a gap between the adjacent metal reflectors to open the space in the lateral directions and the heat dissipating material is diffused into locations covering the side surfaces of the metal reflectors through the opening.

7. The quantum dot LED module according to claim 5, wherein the heat dissipating material is diffused between the LED chip and the bendable PCB and between the side surfaces of the metal reflector and the bendable PCB through the lower portion of the space.

8. The quantum dot LED module according to claim 5, wherein one or more Zener diodes are arranged in the space.

9. The quantum dot LED module according to claim 5, wherein the first electrode pad and the second electrode pad protrude more downward than the lower surface of the metal reflector.

10. The quantum dot LED module according to claim 5, wherein the area of the light emitting surface of the quantum dot plate is larger than the contact area of the quantum dot plate with the LED chip.

11. The quantum dot LED module according to claim 5, wherein the bendable PCB comprises a heat dissipating metal layer formed of Cu or its alloy, an electrode layer formed with first electrodes corresponding to the first electrode pads and second electrodes corresponding to the second electrode pads, and an intermediate layer interposed between the electrode layer and the heat dissipating metal layer.

12. The quantum dot LED module according to claim 11, further comprising first solder joints through which the first electrode pads are bonded to the first electrodes, second solder joints through which the second electrode pads are bonded to the second electrodes, and reinforcing resin parts reinforcing the bonding state of the first electrode pads and the first electrodes through the first solder joints and the bonding state of the second electrode pads and the second electrodes through the second solder joints.

13. The quantum dot LED module according to claim 12, wherein both the first solder joints and the second solder joints are embedded in the reinforcing resin parts.

14. The quantum dot LED module according to claim 12, wherein the reinforcing resin parts are formed using a resin material mixed with a plurality of solder balls, and the first solder joints and the second solder joints are formed using a solder cream.

* * * * *